United States Patent [19]

Erhart et al.

[11] Patent Number: 5,578,957
[45] Date of Patent: *Nov. 26, 1996

[54] INTEGRATED CIRCUIT HAVING DIFFERENT POWER SUPPLIES FOR INCREASED OUTPUT VOLTAGE RANGE WHILE RETAINING SMALL DEVICE GEOMETRIES

[75] Inventors: Richard A. Erhart, Chandler; Thomas W. Ciccone, Paradise Valley, both of Ariz.

[73] Assignee: Vivid Semiconductor, Inc., Chandler, Ariz.

[*] Notice: The term of this patent shall not extend beyond the expiration date of Pat. No. 5,510,748.

[21] Appl. No.: 564,540

[22] Filed: Nov. 27, 1995

Related U.S. Application Data

[63] Continuation of Ser. No. 183,036, Jan. 18, 1994, Pat. No. 5,510,748.

[51] Int. Cl.[6] .............................. H03L 5/00; G09G 5/00
[52] U.S. Cl. ........................ 327/333; 327/530; 345/208; 345/210
[58] Field of Search ................... 327/333, 530; 345/208, 210

[56] References Cited

U.S. PATENT DOCUMENTS

| | | | |
|---|---|---|---|
| 4,575,721 | 3/1986 | Delgrange et al. | 340/776 |
| 4,636,784 | 1/1987 | Delgrange et al. | 340/771 |
| 4,714,921 | 12/1987 | Kanno et al. | 340/784 |
| 4,845,488 | 7/1989 | Kelly | 340/721 |
| 4,955,696 | 9/1990 | Taniguchi et al. | 350/332 |
| 5,105,187 | 4/1992 | Plus et al. | 340/784 |
| 5,120,991 | 6/1992 | Takahashi | 307/270 |
| 5,168,270 | 12/1992 | Masumori et al. | 340/784 |
| 5,170,155 | 12/1992 | Plus et al. | 340/784 |
| 5,170,158 | 12/1992 | Shinya | 340/800 |
| 5,192,945 | 3/1993 | Kusada | 340/784 |
| 5,196,738 | 3/1993 | Takahara et al. | 340/784 |
| 5,198,747 | 3/1993 | Haight | 323/303 |
| 5,283,565 | 2/1994 | Suzuki et al. | 327/108 |

*Primary Examiner*—David C. Nelms
*Assistant Examiner*—Trong Phan
*Attorney, Agent, or Firm*—Cahill, Sutton & Thomas, P.L.C.

[57] ABSTRACT

An integrated circuit for driving an active or passive matrix liquid crystal display panel or the like provides an analog output signal which switches through a voltage range that exceeds the safe operating voltage of the CMOS transistors from which it is formed. Duplicate digital to analog conversion circuits are provided on the integrated circuit but are operated from two different power supply voltage ranges. Each voltage range has a magnitude less than the safe operating voltage. The analog output signals generated by the duplicate digital to analog conversion circuits are coupled to an output multiplexer that is responsive to a control signal for selecting one of the two analog output signals to the output terminal of the integrated circuit. The output multiplexer includes an n-channel pass transistor and a p-channel pass transistor coupled to the output terminal in parallel with each other and responsive to the control signal for passing one or the other of the dual analog signals to the output terminal. Exposure of the pass transistors to voltages exceeding the safe operating voltage is avoided by inserting shielding transistors in series therewith.

7 Claims, 3 Drawing Sheets

INTEGRATED CIRCUIT HAVING DIFFERENT POWER SUPPLIES FOR INCREASED OUTPUT VOLTAGE RANGE WHILE RETAINING SMALL DEVICE GEOMETRIES

This is a continuation of parent application Ser. No. 08/183,036, filed on Jan. 18, 1994, for "Integrated Circuit Having Different Power Supplies For Increased Output Voltage Range While Retaining Small Device Geometries", which is U.S. Pat. No. 5,510,748 issued on Apr. 23, 1996. The Applicant has filed herein a Terminal Disclaimer under 37 C.F.R. § 1.321(b) to disclaim the terminal part of any patent granted on this application Ser. No. 08/564,540 which would extend beyond the expiration date of U.S. Pat. No. 5,510,748

BACKGROUND OF THE INVENTION

1. Field of the Invention

The present invention relates generally to integrated circuits for driving an active or passive matrix liquid crystal display (LCD) or the like, and more particularly, to an integrated circuit which provides a relatively high voltage output driver signal while retaining smaller device geometries allowed by using low voltage CMOS processing.

2. Description of the Background Art

Active matrix LCD displays are used today in a variety of products, including hand-held games, hand-held computers, and laptop/notebook computers. These displays are available in both gray-scale and color forms, and are typically arranged as a matrix of intersecting rows and columns. The intersection of each row and column forms a pixel, or dot, the density and/or color of which can be varied in accordance with the voltage applied thereto in order to define the gray shades of the liquid crystal display. These various voltages produce the different shades of color on the display, and are normally referred to as "shades of gray" even when speaking of a color display.

It is known to control the image displayed on the screen by individually selecting one row of the display at a time, and applying control voltages to each column of the selected row. This process is carried out for each individual row of the screen. After each row has been selected, the process is repeated to refresh and/or update the displayed image.

LCD displays used in computer screens require a large number of column driver outputs which must operate at voltages from 8 volts to as high as 20 volts (hereinafter, "high voltage"). Color displays usually require three columns per pixel, one for each of the three primary colors to be displayed. Thus, a typical VGA (480 rows×640 columns) color liquid crystal display includes 640×3, or 1,920 column lines which must be driven at high voltage by a like number of column driver outputs.

The column driver circuitry is typically formed upon monolithic integrated circuits. Assuming that an integrated circuit can be provided with 192 column output drivers, then a color VGA display screen requires 10 of such integrated circuits (10×192=1,920). Due to the relatively large number of such column driver integrated circuits that are required by such a color VGA display screen, the cost of such column driver integrated circuits can greatly influence the overall cost of the display.

CMOS is the most widely used technology for integrated circuits today. However, the magnitude of the voltage that can be used to power CMOS circuits is dependent upon the physical dimensions of the individual transistors and the particular processing utilized to manufacture the transistors. In general, as the required operating voltage is increased, the individual transistors must be made larger, and the processing of the integrated circuits becomes more complex. This equates to additional cost for the device since the total chip area of the integrated circuit and the complexity of the manufacturing process are major factors in the cost of an integrated circuit. Increased transistor area means lower device density, larger integrated circuits, lower yields, and higher cost per integrated circuit. In order to increase the voltage tolerance of CMOS transistors to breakdown conditions, the dimensions of the CMOS transistors must be increased in a linear relationship to the amount of voltage tolerance desired. Thus, if the CMOS transistors must have double the breakdown voltage tolerance, then the dimensions of such transistors must be roughly doubled. However, overall chip area goes up by the square of transistor dimensions, so doubling device spacings can result in an increase in required chip area by a factor of four.

In addition, the reliability of a CMOS integrated circuit is directly affected by the voltage at which it is operated and by the sizes of the individual transistors. This is due to two different phenomena observed in CMOS integrated circuits. One such phenomena is a breakdown mechanism caused by a larger electric field imposed across the gate oxide of the CMOS transistors. The voltage at which the gate oxide of a CMOS transistor may break down in actuality is typically less than the theoretical breakdown voltage that might be predicted for a given oxide thickness. Defects in the gate oxide can allow the gate oxide of the CMOS device to break down over time at voltages far below the theoretical breakdown voltage for such given oxide thickness. For example, the theoretical gate oxide breakdown voltage for a 1.2 micron CMOS process might be 18 volts; in practice, however, the voltage across such gate oxide must be maintained below 8 volts or the reliability of the integrated circuit will be compromised over time.

A second phenomena observed in CMOS circuits is a problem related to channel breakdown wherein the application of voltages that exceed a certain maximum voltage limit across the source and drain terminals of CMOS transistors can, over time, compromise the reliability of the devices, even though such source-to-drain voltages may be less than the predicted theoretical source-to-drain channel breakdown voltage value. Additional voltage sensitive mechanisms include junction breakdown and field threshold effects which can impair performance of an integrated circuit. These considerations ordinarily dictate the use of larger geometry, more complex processes for high voltage CMOS circuits. Thus, as used in this specification and the accompanying claims, the term "breakdown voltage" should be understood to refer to the maximum practical voltage, or safe operating voltage, which may be applied across the gate oxide of the CMOS transistors and/or across the source and drain terminals of such CMOS transistors to ensure adequate reliability, rather than the actual or theoretical voltages at which such breakdown is observed.

As indicated above, integrated circuits which serve as column drivers for active matrix LCD displays must provide output voltages in the range of 8 to 20 volts. This is a relatively high voltage for CMOS circuits, and the higher operating voltage generally requires that the area of each CMOS switching transistor be larger due to the need for larger geometry processes with thicker gate oxides (to reduce the electric field) and longer channels in order to tolerate the higher operating voltage. As explained above, for a particular CMOS process, there is a maximum voltage which can be applied across each CMOS transistor in order to ensure adequate reliability; this maximum voltage can be increased by increasing the size of each CMOS transistor and thickening the gate oxide insulating layer, but such CMOS processing is more expensive. Hence, the high output voltages required to drive LCD displays has made the column driver integrated circuits relatively expensive. Moreover, because a large number of column driver integrated circuits are needed to drive a display, the column driver integrated circuits represent a significant portion of the total cost of the display.

Accordingly, it is an object of the present invention to generate the higher voltage output signals required to drive the columns of an active or passive matrix LCD display while still being able to retain the smaller device geometries of lower-voltage CMOS integrated circuits produced using lower-cost low-voltage CMOS processing.

It is another object of the present invention to reduce the cost of column driver integrated circuits used to drive active or passive matrix LCD displays.

It is still another object of the present invention to provide column driver integrated circuits used to drive active or passive matrix LCD displays which integrated circuits, when compared with known column driver integrated circuits, require lesser integrated circuit chip area to provide the same number of column drivers.

It is a further object of the present invention to provide such a monolithic column driver integrated circuit wherein much of the CMOS circuitry used to generate the voltage that drives the column of the active or passive matrix LCD display is operated from a power supply range that is of a smaller magnitude than the amplitude of the column driver output signal.

A still further object of the present invention is to provide a CMOS monolithic integrated circuit that provides an output signal that can be switched through a relatively wide output range while limiting the voltage across any particular CMOS device to a voltage magnitude that is significantly less than the amplitude of the output signal.

These and other objects of the present invention will become more apparent to those skilled in the art as the description of the present invention proceeds.

SUMMARY OF THE INVENTION

Briefly described, and in accordance with a preferred embodiment thereof, the present invention provides a monolithic integrated circuit composed of transistors subject to a given breakdown voltage and generating an output signal having a predetermined amplitude that exceeds the given breakdown voltage. The monolithic integrated circuit includes first and second power supply conductors for receiving first and second power supply voltages which define a first voltage range having a magnitude below the given breakdown voltage. A first set of circuitry is coupled to and powered by the first and second power supply conductors for producing a first output signal having a voltage within the first voltage range.

The monolithic integrated circuit also includes third and fourth power supply conductors for receiving third and fourth power supply voltages which define a second voltage range having a magnitude below the given breakdown voltage. A second set of circuitry is coupled to and powered by the third and fourth power supply conductors for producing a second output signal having a voltage within the second voltage range.

The monolithic integrated circuit additionally includes a control terminal for receiving a control signal used to select either the first output signal or the second output signal. Also, the monolithic integrated circuit includes an output circuit that is coupled to the first and second sets of circuitry for receiving the first and second output signals, respectively. The output circuit includes an output terminal for providing a full-range output signal that can vary over the composite range of the first and second voltage ranges. The output circuit is responsive to the aforementioned control signal for selecting either the first output signal or the second output signal to the output terminal.

One particularly useful embodiment of the invention is to provide the first and second sets of circuitry as redundant circuits which respond to the same input signal(s), and which perform substantially identical functions as each other, but within two different power supply voltage ranges. By way of example, both the first and second sets of circuitry may be digital-to-analog conversion circuits that are responsive to the same digital input signals to produce two analog output signals at different voltage levels. The output circuit then selects one of the two different analog output signals to the output terminal in order to provide an analog output signal that has an overall voltage range that exceeds the first voltage range and which also exceeds the second voltage range. While the first and second sets of circuitry are largely redundant and therefore require double the number of transistors, the relatively small device geometries used to form the transistors within the first and second sets of circuitry results in a net savings of integrated circuit chip area.

In the preferred embodiment of the present invention, the first and second sets of circuitry included in the monolithic integrated circuit are formed of CMOS transistors that include a gate isolated from a channel by a gate oxide, and both the first voltage range and the second voltage range each have a magnitude that is less than the gate oxide breakdown voltage of the transistors used to form first and second sets of circuitry, while the magnitude of the final output signal provided at the output terminal is greater than the gate oxide breakdown voltage for such CMOS transistors. Such a monolithic integrated circuit can be advantageously used, for example, to drive analog voltages upon the columns of an active matrix LCD display panel in order to minimize the cost of the column driver integrated circuit.

The present invention includes instances wherein the first and second voltage ranges overlap with each other, instances wherein the first and second voltage ranges do not overlap with each other, as well as instances wherein the first and second voltage ranges are continuous with one another. In the latter instance, for example, the second power supply conductor and the third power supply conductor may be coincident with each other.

As mentioned above, the present invention includes an output circuit which provides a full range output signal. The preferred embodiment of the present invention includes a first n-channel CMOS transistor having source and drain terminals for selectively coupling the first output signal of the first set of circuitry to the full range output terminal. Likewise, a first p-channel CMOS transistor having source and drain terminals selectively couples the second output signal of the second set of circuitry to the full range output terminal. A level shifting circuit is coupled to the control terminal and is responsive to the control signal for generating a first enabling signal within the first voltage range and a second enabling signal within the second voltage range. The gate terminal of the first n-channel CMOS transistor in the output circuit receives the first enabling signal for selecting the first output signal to the output terminal, and the gate terminal of the first p-channel transistor in the output circuit receives the second enabling signal for selecting the second output signal to the output terminal.

In order to limit the voltages applied across the above-described first n-channel CMOS transistor in the output circuit, a second n-channel CMOS transistor is interposed in series between the first n-channel CMOS transistor and the output terminal. Assuming that the first power supply voltage is more positive than the second power supply voltage within the above-described first voltage range, the gate terminal of the second n-channel CMOS transistor is coupled to the first power supply conductor for receiving the first power supply voltage, thereby limiting the voltage at the source (drain) of the first n-channel CMOS transistor.

Similarly, in order to limit the voltages applied across the above-described first p-channel CMOS transistor in the output circuit, a second p-channel CMOS transistor is interposed in series between the first p-channel CMOS transistor and the output terminal. Assuming that the third power supply voltage is more positive than the fourth power supply voltage within the above-described second voltage range, the gate terminal of the second p-channel CMOS transistor is coupled to the fourth power supply conductor for receiving the fourth power supply voltage, thereby limiting the voltage at the source (drain) of the first p-channel CMOS transistor.

DETAILED DESCRIPTION OF THE PREFERRED EMBODIMENTS

Figure 1:
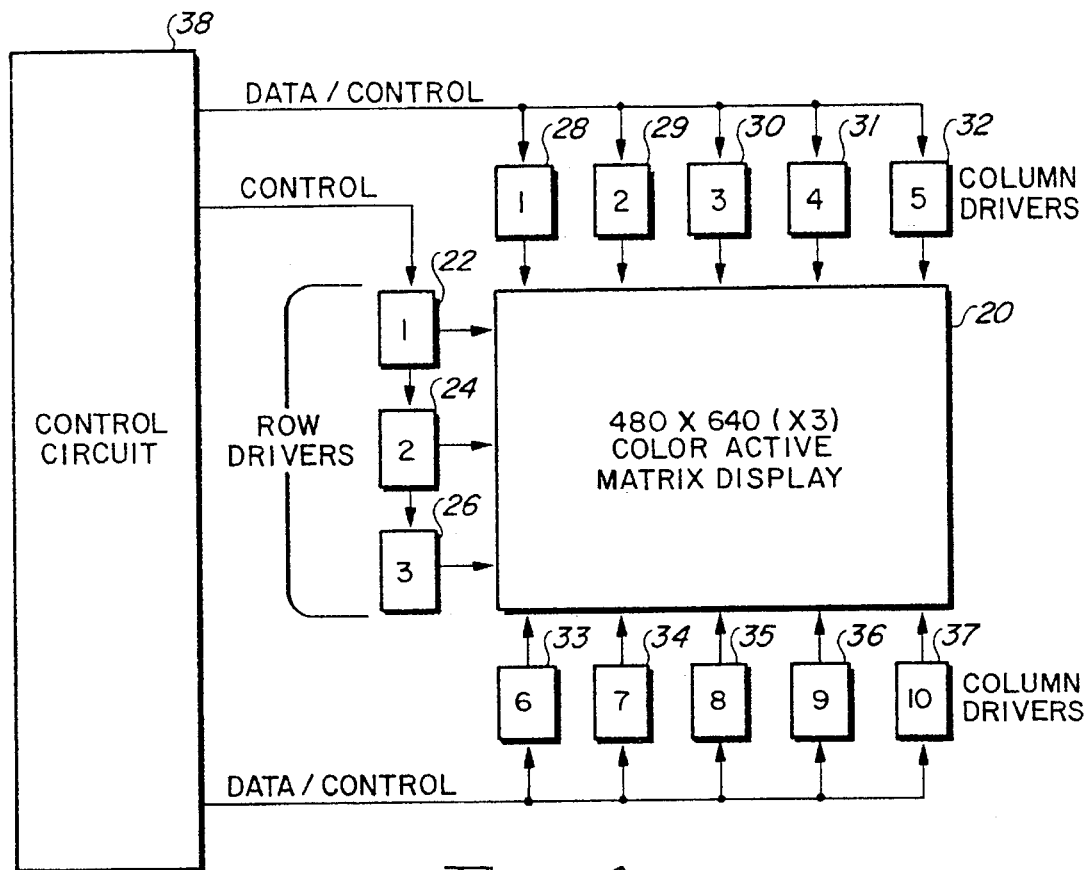
FIG. 1 is a block diagram of an active matrix LCD display including column and row driver circuitry and control circuitry for controlling the image displayed upon the LCD display.

Shown in FIG. 1 is a typical active matrix display system. The active matrix LCD display screen itself is designated by reference numeral 20 and may include 480 rows and 640 columns for a typical black and white gray-scale LCD display. The intersection of each row and each column is called a pixel, and a thin film transistor (TFT) is provided at each such intersection to selectively couple the voltage on each column to a storage capacitor at each pixel when each row is selected. The intensity of each pixel is selected by controlling the voltage applied to the storage capacitor at each pixel of the display. For a color LCD display, there are three times the number of columns to provide for three primary colors at each pixel of the screen.

During each refresh cycle of the display, each of the 480 rows is successively selected by row drivers 22, 24, and 26 for enabling the thin film transistors in the selected row and allowing the voltages present on the 640 columns to be stored upon the storage capacitors at each of the 640 pixels in the selected row. As shown in FIG. 1, ten column driver integrated circuits 28–37 each drive 64 of the 640 columns in the black and white LCD display (or 3 times 64, or 192 columns, for a color display). A control circuit 38 provides data and control signals to the row drivers 22–26 and column drivers 28–37 to synchronize such components in order to display a desired image. The basic drive circuitry shown in FIG. 1 is known in the art and does not itself form a part of the present invention.

Figure 2:
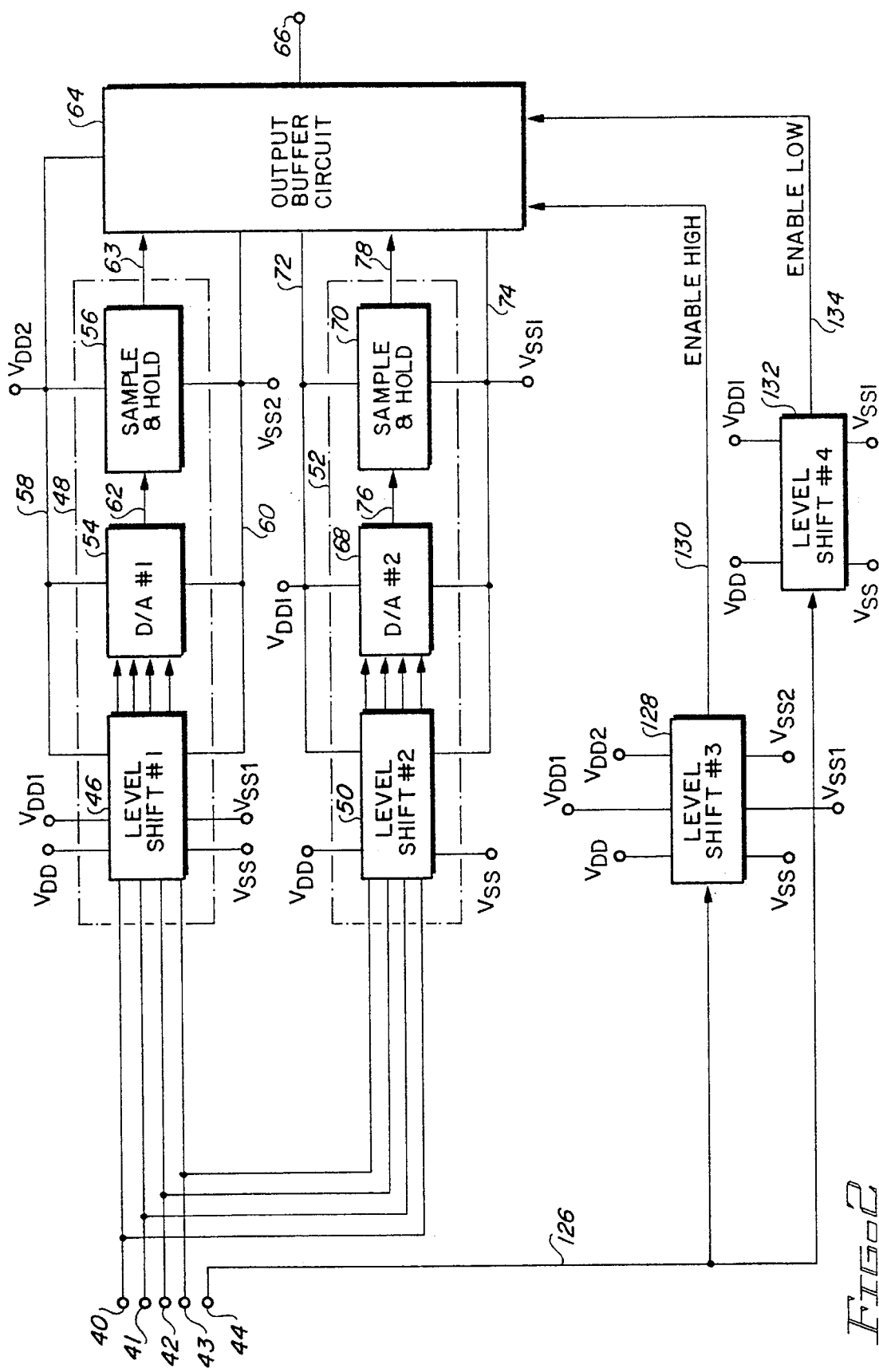
FIG. 2 is a block diagram of column driver circuitry including first and second sets of circuitry operated at two different voltage ranges and used to apply an analog voltage to a column of the LCD display.

Referring now to FIG. 2, a portion of a monolithic integrated circuit column driver is shown incorporating a preferred embodiment of the present invention. Within FIG. 2, input terminals 40–44 receive digital signals that indicate the intensity desired at a particular pixel in a selected row of the LCD display shown in FIG. 1. To simplify the understanding of the present invention, the circuitry shown in FIG. 2 omits several elements that might typically be found in an integrated circuit column driver circuit, Such as digital data sampling elements to sample and store (on-board the integrated circuit) a plurality of digital values corresponding to the plurality of output voltages to be driven onto the columns of the LCD display. A more complete column driver integrated circuit which embodies the present invention is described and illustrated within co-pending patent application Ser. No. 08/183,474, entitled "INTEGRATED CIRCUIT FOR DRIVING LIQUID CRYSTAL DISPLAY USING MULTI-LEVEL D/A CONVERTER", filed on even date herewith, and assigned to the assignee of the present application; the text and drawings of such co-pending patent application are hereby incorporated by reference into this patent application specification. The above-identified co-pending patent application discloses a particularly advantageous form of digital-to-analog conversion circuit for use in such a column driver integrated circuit. As explained more fully in the above-identified co-pending patent application, the operation of such a column driver integrated circuit can be pipelined for allowing the three functions of data sampling, digital-to-analog conversion, and column output driving, to be carried on simultaneously.

In the simplified example shown in FIG. 2, input terminals 40–44 collectively receive a five-bit digital word capable of assuming 32 different binary bit patterns for specifying 32 different intensity levels. Those skilled in the art will understand that a greater number of input bits may be provided if desired to define a greater number of shades of gray for each pixel in the display. Referring briefly to FIG. 1, control circuit 38 provides such input bits to the integrated circuit column driver as standard 5 Volt CMOS logic signals. Such standard 5 Volt CMOS logic circuitry typically includes two power supply voltages, Vss (ground potential) and Vdd (+5 Volts).

A shown in FIG. 2, input terminals 40–43, corresponding to the four least-significant bits of the five-bit digital input word, are provided to a first level shift circuit block 46 provided within a first group of circuitry enclosed by dashed block 48. The first group of circuitry 48, or upper circuit block, includes a digital-to-analog converter circuit block 54 and a sample-and-hold block 56. Each of the component blocks 46, 54, and 56 within upper circuit block 56 are coupled to a first power supply conductor 58 and a second power supply conductor 60. First power supply conductor 58 receives a first power supply voltage VDD2, and second power supply conductor 60 receives a second power supply voltage VSS2. For purposes of illustration, it will be assumed herein that first power supply voltage VDD2 is approximately +12 Volts, while second power supply voltage VSS2 is approximately +6 Volts. Level shift block 46 serves to convert the four input signals, which are standard 5 Volt CMOS logic levels, to levels adapted to drive digital-to-analog converter circuit block 54 within the elevated voltage range +6 Volts to +12 Volts, in a manner described in greater detail below in conjunction with FIG. 4.

First and second power supply voltages VDD2 and VSS2, respectively, define a first voltage range between +6 Volts and +12 Volts, and the first voltage range has a magnitude of 6 Volts. Accordingly, the CMOS transistors used to form the digital-to-analog converter block 54 and the CMOS transistors used to form the sample-and-hold block 56 can be similar to the type used to fabricate conventional 5 Volt CMOS logic circuits, since the voltage range over which such devices is operated is limited to a six Volt range. Even if the gate oxide breakdown voltage of the CMOS process used to form such transistors is 7–8 Volts, no special precautions need be taken when forming circuit blocks 48 and 56 since the voltage range over which such circuitry is operated is limited to a six Volt range (+6 Volts to +12 Volts).

The four-bit digital-to-analog CMOS converter circuit represented by circuit block 54 may be one of any number of digital-to-analog CMOS converter circuits known to those of ordinary skill in the art and designed to operate within a six Volt range. Likewise, the sample and hold circuit block 56 may be any suitable known form designed to operate within a six Volt range; one suitable form of known sample-and-hold circuit that may be used is shown in U.S. Pat. No. 5,170,158 to Shinya, the disclosure of which is hereby incorporated into the present specification by reference.

Digital-to-analog converter circuit 48 receives the four level-shifted input signals from level shift circuit 46 and generates a first, or upper, analog output voltage on conductor 62. This first analog output voltage might range between as low as +6 Volts to as high as +12 Volts and may be one of sixteen different analog voltages within such first voltage range. This first analog output signal is coupled to the input of sample-and-hold circuit block 56 for temporarily saving the first analog output voltage. Sample-and-hold circuit block 56 is strobed by a clock pulse (not shown) that is synchronous with the presentation of a new digital value upon input terminals 40–44; thus, sample-and-hold circuit block 56 can hold the analog voltage to be driven onto the column driver output while digital-to-analog converter circuit 48 is processing a new analog voltage to be output on a successive clock pulse. For more details concerning the pipelined nature of the operation of such a column driver integrated circuit, see the disclosure of the above-identified co-pending patent application incorporated herein by reference.

The output of sample-and-hold circuit 56 is coupled by conductor 63 to a first input of output buffer circuit 64. output buffer circuit 64 includes a full-range output terminal 66, and in a manner described below, can select the first analog output voltage provided by conductor 63 to output terminal 66 for applying such voltage to a column of the LCD display.

Still referring to FIG. 2, input terminals 40–43 are also provided to a second level shift circuit block 50 provided within a second group of circuitry enclosed by dashed block 52. The second group of circuitry 52, or lower circuit block, includes a digital-to-analog converter circuit block 68 and a sample-and-hold block 70. Each of the component blocks 50, 68, and 70 within lower circuit block 52 are coupled to a third power supply conductor 72 and a fourth power supply conductor 74. Third power supply conductor 72 receives a third power supply voltage VDD1, and fourth power supply conductor 74 receives a fourth power supply voltage VSS1. For purposes of illustration, it will be assumed herein that third power supply voltage VDD1 is approximately +6 Volts, while fourth power supply voltage VSS1 is approximately 0 Volts, or ground potential. Level shift block 50 serves to convert the four input signals, which are standard 5 Volt CMOS logic levels, to levels adapted to drive digital-to-analog converter circuit block 68 within the expanded voltage range of 0 Volts to +6 Volts, in a manner described in greater detail below in conjunction with FIG. 3.

Third and fourth power supply voltages VDD1 and VSS1, respectively, define a second voltage range between 0 Volts and +6 Volts, and this second voltage range has a magnitude of 6 Volts. Accordingly, the CMOS transistors used to form the digital-to-analog converter block 68 and the CMOS transistors used to form the sample-and-hold block 70 can be similar to the type used to fabricate conventional 5 Volt CMOS logic circuits, since the voltage range over which such devices is operated is limited to a six Volt range. Even if the gate oxide breakdown voltage of the CMOS process used to form such transistors is 7–8 Volts, no special precautions need be taken when forming circuit blocks 68 and 70 since the voltage range over which such circuitry is operated is limited to a six Volt range (0 Volts to +6 Volts).

The four-bit digital-to-analog CMOS converter circuit represented by circuit block 68 may be identical in structure and function to digital-to-analog converter circuit block 54, with the exception of the power supply conductors to which they are connected. Likewise, the sample-and-hold circuit block 70 may be identical to sample-and-hold circuit block 56, again with the exception of the power supply conductors to which they are connected. While the circuitry within digital-to-analog CMOS converter circuit 68 duplicates the circuitry contained in digital-to-analog converter circuit 54, the CMOS devices used to form such circuits can be relatively small in size, since none of such CMOS transistors are exposed to more than six Volts in this example. However, it must be kept in mind that the area required on an integrated circuit chip to implement a circuit typically increases in accordance with the square of increases in device geometries. Thus, doubling the size of typical of CMOS transistors in order to withstand higher voltages can result increase the required integrated circuit chip area by a factor of four. In contrast, by duplicating small geometry CMOS devices to duplicate functions (such as digital-to-analog conversion) at two different voltage levels only increases required integrated circuit chip area by a factor of at most two. Accordingly, even though the splitting of the integrated circuit power supplies requires that certain circuit components formed on the chip must be formed twice, once on each voltage level, the savings in chip real estate by using small device geometries more than compensates for this disadvantage.

Digital-to-analog converter circuit 68 receives the four level-shifted input signals from level shift circuit 50 and generates a second, or lower, analog output voltage on conductor 76. This second analog output voltage might range between as low as 0 Volts to as high as +6 Volts and may be one of sixteen different analog voltages within such second voltage range. This second analog output signal is coupled to the input of sample-and-hold circuit block 70 for temporarily saving the second analog output voltage. The output of sample-and-hold circuit 70 is coupled by conductor 78 to a second input of output buffer circuit 64. Output buffer circuit 64, in a manner described below, can select the second analog output voltage provided by conductor 78 to output terminal 66 for applying such voltage to a column of the LCD display.

As stated above, conductor 63 provides an analog output signal to output buffer circuit 64 that ranges between +6 Volts and +12 Volts, while conductor 78 provides an analog output voltage that ranges between 0 Volts and +6 Volts. Thus, depending upon which of the two analog output signals is selected, output buffer circuit 64 can provide an analog output signal at output terminal 66 that can vary over the full voltage range from 0 Volts to +12 Volts. The manner by which output buffer circuit 64 performs such selection is described in greater detail below in conjunction with FIG. 5.

Figure 4:
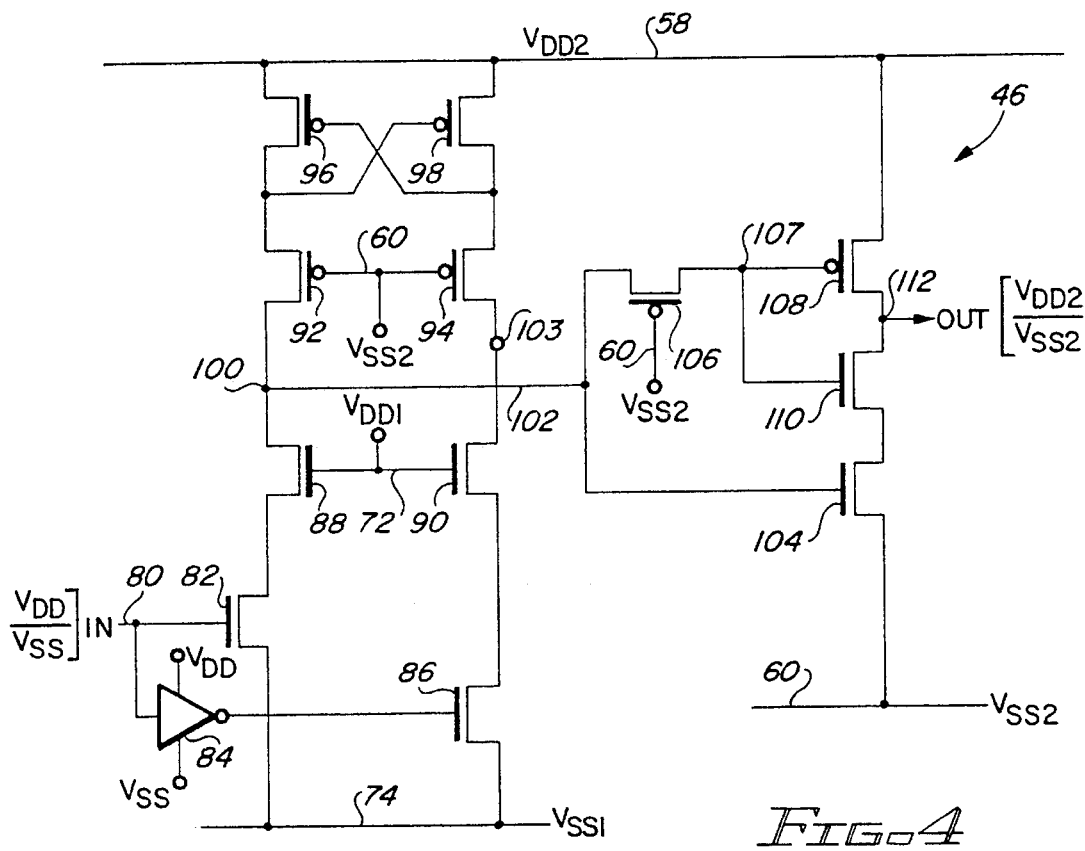
FIG. 4 is a schematic diagram of a second level shifting circuit used to generate an input signal for a second set of circuitry operated within a second voltage range.

As mentioned above, level shift circuit block 46 converts each of the four input signals to operate within the elevated voltage range of upper circuit block 48. Referring to FIG. 4, level shift circuitry is shown for one of the four input signals. In FIG. 4, it is assumed that an "n-well" CMOS process is used to fabricate the integrated circuit, that the substrate is a p-type semiconductor that is tied to ground. In FIG. 4, input conductor 80 receives an input signal that switches between conventional 5 Volt CMOS logic levels of approximately VDD (+5 Volts) and VSS (ground). Input conductor 80 is coupled to the gate terminal of n-channel CMOS transistor 82 and to the input of a standard CMOS inverter 84. The output of inverter 84 is coupled to the gate terminal of n-channel CMOS transistor 86. The source terminals of transistors 82 and 86 are each connected to power supply conductor 74 for receiving power supply voltage VSS1 (nominally, ground). Incidentally, as used in this specification and accompanying claims, the terms "source" and "drain" are used interchangeably to refer to the terminals connected to opposing sides of the channel formed in each CMOS device. The drain terminal of transistor 82 is coupled to the source of n-channel CMOS transistor 88, while the drain terminal of transistor 86 is coupled to the source of n-channel CMOS transistor 90. The gate terminals of transistors 88 and 90 are both coupled to power supply conductor 72 for receiving voltage VDD1 (nominally, +6 Volts). The drain terminals of transistors 88 and 90 are coupled to the source terminals of p-channel CMOS transistors 92 and 94, respectively. The gate terminals of both transistors 92 and 94 are coupled to power supply conductor 60 for receiving voltage VSS2 (nominally, +6 Volts). The drain terminals of transistors 92 and 94 are coupled to the source terminals of cross-coupled p-channel CMOS transistors 96 and 98, respectively, which serve as weak pull-up transistors. The drain terminals of cross-coupled transistors 96 and 98 are each coupled to power supply conductor 58 for receiving voltage VDD2 (nominally, +12 Volts).

Still referring to FIG. 4, node 103 is disposed at the intersection of the drain terminal of transistor 90 and the source terminal of transistor 94. Node 100 is disposed at the intersection of the drain of transistor 88 and the source of transistor 92 and is coupled to conductor 102. Conductor 102 is connected to the gate terminal of n-channel CMOS transistor 104 and to the drain terminal of p-channel CMOS transistor 106. The source of transistor 104, and the gate terminal of transistor 106, are both coupled to power supply conductor 60 for receiving voltage VSS2. The source terminal of transistor 106 is coupled to node 107 and to the gate terminals of p-channel CMOS transistor 108 and n-channel CMOS transistor 110. The drain terminal of transistor 108 is coupled to VDD2 conductor 58. The source terminal of transistor 108 is coupled to the drain terminal of transistor 110 at node 112 to provide an output signal adapted to switch between voltages VDD2 and VSS2 within the upper circuit block 48 of FIG. 2. The source terminal of transistor 110 is coupled to the drain terminal of transistor 104.

The operation of the level shift circuit block 46 shown in FIG. 4 will now be described. The input signal provided to conductor 80 switches transistors 82 and 86 differentially. The voltages produced at nodes 100 and 102 switch "full rail", i.e., the voltages at such nodes switch from VSS1 (nominally ground) all the way up to VDD2 (nominally +12 Volts). By interposing transistor 88 between node 100 and the drain terminal of transistor 82, the presence of voltage VDD2 at node 100 is isolated from the drain terminal of transistor 82; as the voltage at the source terminal of transistor 88 begins to rise toward VDD1, transistor 88 is rendered non-conductive. Accordingly, the voltage at the drain terminal of transistor 82 never rises above voltage VDD1, and no gate oxide breakdown or channel breakdown occurs in transistor 82. Transistor 90 similarly isolates the drain terminal of transistor 86 when node 103 switches high to VDD2. Likewise, transistor 92 serves to protect transistors 96 and 98 from breakdown when node 100 pulls down to ground; in this instance, as node 100 begins to drop in voltage, the drain terminal of transistor 92 also falls until it reaches a threshold voltage above VSS2, at which point transistor 92 is rendered non-conductive. Transistor 94 functions in a similar manner to prevent the voltage at the drain terminal of transistor 94 from falling below voltage VSS2; accordingly, gate oxide breakdown and channel breakdown will not occur in transistors 96 and 98.

Now, moving to the second stage of the level shift circuit shown in FIG. 4, when node 100 drops to VSS1 (ground), transistor 104 is off, and transistor 106 is conductive and begins to pull node 107 toward ground. Transistor 108 is rendered conductive and provides VDD2 as the output voltage at node 112. However, transistor 106 prevents node 107 from falling below voltage VSS2, as transistor 106 would then be rendered non-conductive. Accordingly, transistors 108 and 110 are protected from gate-oxide breakdown. If node 100 now switches high to VDD2, transistor 104 is turned on, and transistor 106 is also conductive for presenting voltage VDD2 at node 107 for switching transistor 108 off and transistor 110 on. Transistors 104 and 110 then present voltage VSS2 to output node 112.

Figure 3:
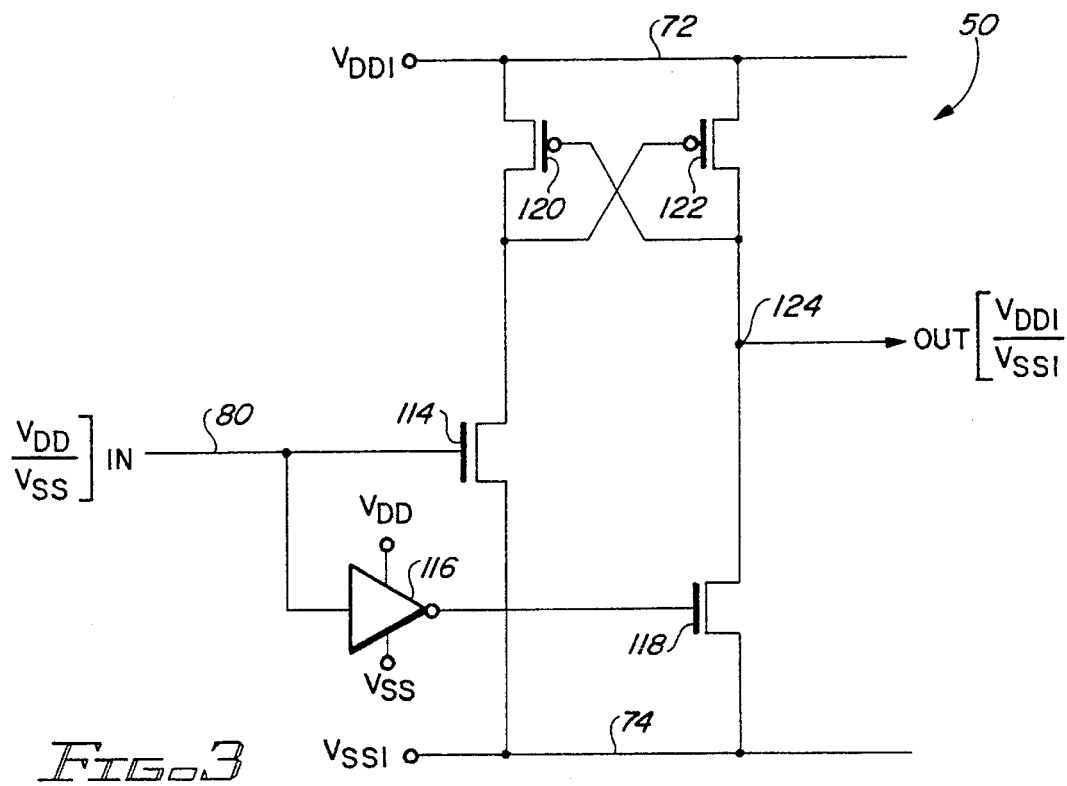
FIG. 3 is a schematic diagram of a first level shifting circuit used to generate an input signal for a first set of circuitry operated within a first voltage range.

It will be recalled that lower circuit block 52 in FIG. 2 also included a level shifting circuit 50. Referring to FIG. 3, the circuitry is shown for level shifting one input signal for driving the lower circuit block within the second voltage range. The circuit shown in FIG. 3 is a simplified form of the circuit shown in FIG. 4. Since the lower circuit block uses a voltage range that is much closer to conventional 5 Volt CMOS logic levels, the protection transistors include in the circuitry of FIG. 4 can be omitted.

As shown in FIG. 3, input conductor 80 receives an input signal that switches between conventional 5 Volt CMOS logic levels of approximately VDD (+5 Volts) and VSS (ground). Input conductor 80 is coupled to the gate terminal of n-channel CMOS transistor 114 and to the input of a standard CMOS inverter 116. The output of inverter 116 is coupled to the gate terminal of n-channel CMOS transistor 118. The source terminals of transistors 114 and 118 are each connected to power supply conductor 74 for receiving power supply voltage VSS1 (nominally, ground). The drain terminals of transistors 114 and 118 are coupled to the source terminals of cross-coupled p-channel CMOS transistors 120 and 122, respectively, which serve as weak pull-up transistors. The drain terminals of cross-coupled transistors 120 and 122 are each coupled to power supply conductor 72 for receiving voltage VDD1 (nominally, +6 Volts). Node 124 is coupled to the drain of transistor 118, the source of transistor 122 and the gate terminal of transistor 120, and serves as the output terminal for level shift circuit 50, providing an output signal that switches between VSS1 and VDD1.

Returning to FIG. 2, two additional signals, ENABLE HIGH and ENABLE LOW, are provided to output buffer circuit 64 in order to select one of the two analog output signals to output terminal 66. In the present example, input pin 44 corresponds to the most-significant bit of the five-bit digital input word presented to input terminals 40–44. Input terminal 44 is coupled by conductor 126 to a third level shift circuit block 128. Level shifter 128 may be virtually identical to the circuitry shown in FIG. 4, with the exception that the polarity of the output is reversed. Level shifter 128 produce an output signal on conductor 130 which switches to voltage VSS2 when input pin 44 is high, and to voltage VDD2 when input pin 44 is low; thus the signal produced by level shift circuit block 128 might more properly be considered the complement of Enable High, since the signal goes low to VSS2 when input pin 44 goes high.

As shown in FIG. 2, conductor 126 is also coupled to a fourth level shift block 132. Level shifter 134 may be virtually identical to the circuitry shown in FIG. 3, with the exception that the polarity of the output is reversed. Level shifter 132 produces an output signal on conductor 132 which switches to voltage VDD1 when input pin 44 is low, and to voltage VSS1 when input pin 44 is high; thus the signal produced by level shift circuit block 132 might more properly be considered the complement of Enable Low, since the signal goes high to VDD1 when input pin 44 goes low.

Figure 5:
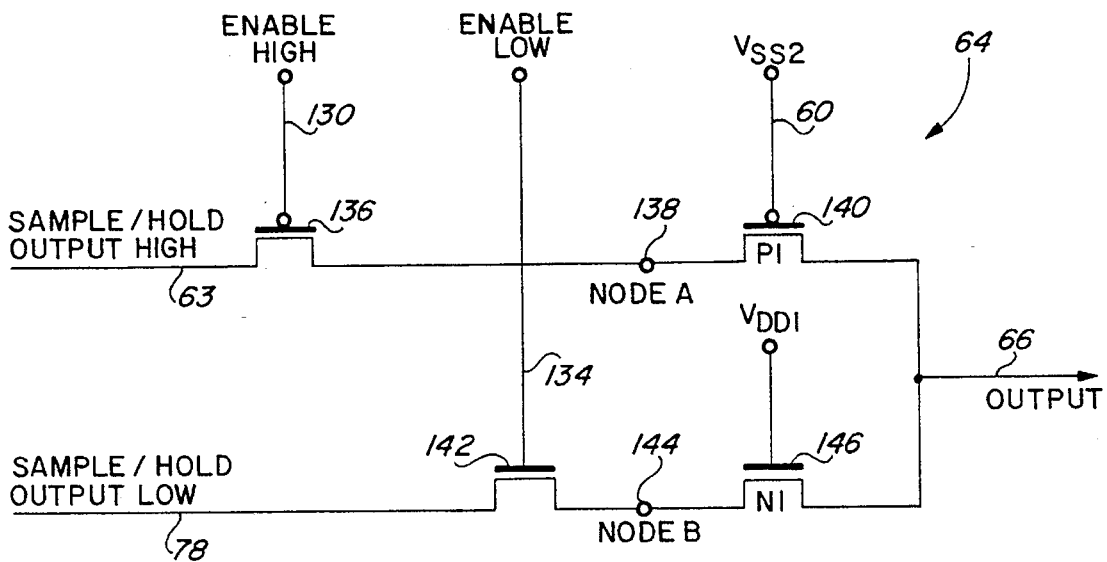
FIG. 5 is a schematic diagram of an output buffer circuit which selects one of the two output signals generated by the first and second groups of circuitry to the column driver output terminal to provide a full range output signal.

FIG. 5 illustrates the circuitry within output buffer circuit block 64 of FIG. 2. Output buffer circuit 64 is essentially an output multiplexer for choosing between the Sample-And-Hold output of upper circuit block 48 and the Sample-And-Hold output of the lower circuit block 52. As shown in FIG. 5, conductor 6S is coupled to the drain terminal of p-channel CMOS transistor 136 for providing thereto the first analog output signal from upper Sample-And-Hold block 56. The gate terminal of transistor 136 is coupled to conductor 130 (ENABLE HIGH) which, as explained above, drops to voltage VSS2 (nominally +6 Volts) when input pin 44 is high. The source terminal of transistor 136 is coupled to node 138 and to the drain terminal of p-channel CMOS transistor 140. The gate terminal of transistor 140 is coupled to power supply conductor 60 for receiving voltage VSS2. The source terminal of transistor 140 is coupled to output terminal 66. Thus, transistor 140 is coupled in series between transistor 136 and output terminal 66.

When ENABLE HIGH (conductor 130) goes low (i.e., to VSS2), transistor 136 is rendered conductive and couples the first analog output signal on conductor 63 to node 138. Transistor 140 is also conductive and couples the first analog output signal from node 138 to output terminal 66. As the first analog output signal on conductor 63 can vary within the first voltage range of VSS2 to VDD2, the output signal at output terminal 66 can vary within the same range whenever input pin 44 (see FIG. 2) is high.

As is also shown in FIG. 5, conductor 78 is coupled to the source terminal of n-channel CMOS transistor 142 for providing thereto the second analog output signal from lower Sample-And-Hold block 70. The gate terminal of transistor 142 is coupled to conductor 134 (ENABLE LOW) which, as explained above, rises to voltage VDD1 (nominally +6 Volts) when input pin 44 is low. The drain terminal of transistor 142 is coupled to node 144 and to the source terminal of n-channel CMOS transistor 146. The gate terminal of transistor 146 is coupled to power supply conductor 72 for receiving voltage VDD1. The drain terminal of transistor 146 is coupled to output terminal 66. Thus, transistor 146 is coupled in series between transistor 142 and output terminal 66.

When ENABLE LOW (conductor 134) goes high (i.e., to VDD1), transistor 142 is rendered conductive and couples the second analog output signal on conductor 78 to node 144. Transistor 146 is also conductive and couples the second analog output signal from node 144 to output terminal 66. As the second analog output signal on conductor 78 can vary within the second voltage range of VSS1 to VDD1, the output signal at output terminal 66 can vary within the same range whenever input pin 44 (see FIG. 2) is low.

Transistor 140 serves to protect transistor 136 against breakdown voltages which might otherwise be imposed across transistor 136 when output terminal 66 is pulled low toward ground by transistor 142. In this event, if node 138 attempts to drop below voltage VSS2, transistor 138 would be rendered non-conductive. Thus, transistor 140 effectively prevents node 138 from falling below voltage VSS2. Likewise, transistor 146 serves to protect transistor 142 against breakdown voltages which might otherwise be imposed across transistor 142 when output terminal 66 is pulled high toward VDD2 by transistor 140. In this event, if node 144 attempts to rise above voltage VDD1, transistor 146 would be rendered non-conductive. Thus, transistor 146 effectively prevents node 144 from rising above voltage VDD1.

By varying the state of input pin 44, the output buffer circuit can selectively couple either the Sample/Hold High output (conductor 63) or the Sample/Hold Low output (conductor 78) to the output port of the multiplexer, thereby permitting the output signal at terminal 66 to vary over the full range between 0 volts and +12 volts in the present example. Thus, input pin 44 functions as a control terminal for receiving a control signal to which the output circuit block 64 is responsive for selecting either the first analog output signal or the second analog output signal to the output terminal. Moreover, because upper circuit block 48 and lower circuit block 52 are both responsive to input pins 40–43, they are responsive to common input signals.

In the example discussed herein, the first power supply voltage range VDD2 to VSS2, and the second power supply range VDD1 to VSS1, have at least one voltage that is in common between them, namely +6 Volts. Those skilled in the art will appreciate that the first and second power supply voltages may, if desired, overlap by a greater degree. For example, the first voltage range could span from +5 Volts to +11 Volts, while the second voltage range could span from 0 Volts to +6 Volts. Such an arrangement might be desired, for example, to compensate for threshold losses. Likewise, those skilled in the art will appreciate that other voltage ranges may be selected, e.g., making VDD2 equal to +10 Volts, VSS2 equal to +5 Volts, VDD1 equal to +5 Volts, and VSS1 equal to 0 Volts. In addition, while the circuitry shown in the preferred embodiment described herein was divided into only two voltage regions (upper and lower circuit blocks), three or more circuit blocks operated at different voltage ranges may also be used if desired to produce a full range output signal of even larger magnitude.

Those skilled in the art will now appreciate that a monolithic integrated circuit structure has been described which allows for the production of a relatively high voltage output signal using CMOS transistors that can be fabricated using low voltage CMOS processing methods. It will be appreciated that this integrated circuit structure can be used to form column driver integrated circuits for driving the columns of an active matrix LCD display while retaining the benefits of lower-voltage, lower-cost CMOS processing. By splitting the power supply voltages into two ranges and duplicating circuit components within each of the two ranges, a full-range output signal can be generated having a magnitude greater than the breakdown voltages of the low-voltage CMOS transistors used to form such integrated circuit while avoiding any breakdown voltage problems.

While the present invention has been described with respect to a preferred embodiment thereof, such description is for illustrative purposes only, and is not to be construed as limiting the scope of the invention. Various modifications and changes may be made to the described embodiment by those skilled in the art without departing from the true spirit and scope of the invention as defined by the appended claims.

We claim:

1. A monolithic integrated circuit having transistors formed therein, the transistors being subject to compromised reliability when operated at voltages exceeding a given safe operating voltage, the integrated circuit generating an output signal having an amplitude that exceeds the given safe operating voltage, said integrated circuit comprising:

a. first and second power supply conductors for receiving first and second power supply voltages which define a first voltage range having a magnitude below the given safe operating voltage;

b. first circuit means coupled between said first and second power supply conductors, said first circuit means including an input terminal for receiving an input signal and including at least one transistor formed within the integrated circuit for producing a first output signal in response thereto, the first output signal having a voltage within the first voltage range;

c. third and fourth power supply conductors for receiving third and fourth power supply voltages which define a second voltage range having a magnitude below the given safe operating voltage and different from the first voltage range, at least one of said third and fourth power supply voltages corresponding to a least positive voltage, and at least one of said first and second power supply voltages corresponding to a most positive voltage, the magnitude of the voltage difference between the most positive voltage and the least positive voltage exceeding the magnitude of the given safe operating voltage;

d. second circuit means coupled between said third and fourth power supply conductors, said second circuit means including an input terminal for receiving an input signal and including at least one transistor formed within the integrated circuit for producing a second output signal in response thereto, the second output signal having a voltage within the second voltage range;

e. a control terminal for receiving a control signal; and f. output circuit means coupled to said first circuit means for receiving the first output signal and being coupled to said second circuit means for receiving the second output signal, said output circuit means including an output terminal and including at least one transistor formed within the integrated circuit for providing to the output terminal a full-range output signal that varies between the first and second voltage ranges, the full range output signal extending substantially up to the most positive voltage and extending substantially down to the least positive voltage, said output circuit means being coupled to said control terminal and responsive to said control signal for selecting either the first output signal or the second output signal to said output terminal.

2. The integrated circuit recited by claim 1 wherein said first circuit means and said second circuit means perform substantially identical functions to each other within two different power supply voltage ranges.

3. The integrated circuit recited by claim 1 wherein said first circuit means and said second circuit means are responsive to a common input signal.

4. The integrated circuit recited by claim 1 wherein said first circuit means and said second circuit means each serve to convert a digital input signal to an analog output signal.

5. The integrated circuit recited by claim 1 wherein the transistors formed within said integrated circuit include CMOS transistors which include a gate isolated from a channel by oxide, and wherein the given safe operating voltage is a maximum voltage beyond which the reliability of the gate oxide isolation is compromised.

6. The integrated circuit recited by claim 1 wherein the first voltage range includes at least one voltage that is included within the second voltage range.

7. The integrated circuit recited by claim 1 wherein the output terminal of said output circuit means is coupled to an active matrix liquid crystal display.

* * * * *